United States Patent
Chen

(10) Patent No.: US 11,374,066 B2
(45) Date of Patent: Jun. 28, 2022

(54) TOUCH PANEL AND DISPLAY DEVICE WITH SHIELDING LAYER GROUNDED THROUGH TOUCH LAYER

(71) Applicant: WUHAN CHINA STAR OPTOELECTRONICS SEMICONDUCTOR DISPLAY TECHNOLOGY CO., LTD., Hubei (CN)

(72) Inventor: Bi Chen, Hubei (CN)

(73) Assignee: WUHAN CHINA STAR OPTOELECTRONICS SEMICONDUCTOR DISPLAY TECHNOLOGY CO., LTD, Hubei (CN)

(*) Notice: Subject to any disclaimer, the term of this patent is extended or adjusted under 35 U.S.C. 154(b) by 717 days.

(21) Appl. No.: 16/322,957

(22) PCT Filed: Jan. 25, 2019

(86) PCT No.: PCT/CN2019/073136
§ 371 (c)(1),
(2) Date: Feb. 3, 2019

(87) PCT Pub. No.: WO2020/113803
PCT Pub. Date: Jun. 11, 2020

(65) Prior Publication Data
US 2021/0359019 A1    Nov. 18, 2021

(30) Foreign Application Priority Data
Dec. 4, 2018   (CN) .......................... 201811475185.6

(51) Int. Cl.
*H01L 27/32* (2006.01)
*G06F 3/044* (2006.01)

(52) U.S. Cl.
CPC .......... *H01L 27/323* (2013.01); *G06F 3/0443* (2019.05); *G06F 3/0446* (2019.05);
(Continued)

(58) Field of Classification Search
None
See application file for complete search history.

(56) References Cited

U.S. PATENT DOCUMENTS

2013/0001059 A1    1/2013   Wu
2013/0229364 A1*   9/2013   Yu ........................ G06F 3/0445
                                                  345/173
(Continued)

FOREIGN PATENT DOCUMENTS

| CN | 103294238 A | 9/2013 |
| CN | 104345927 A | 2/2015 |
| CN | 106325639 A | 1/2017 |

*Primary Examiner* — Amare Mengistu
*Assistant Examiner* — Sarvesh J Nadkarni
(74) *Attorney, Agent, or Firm* — Soroker Agmon Nordman

(57) ABSTRACT

A touch panel includes a shielding layer having a shielding portion and a conductive portion. An insulating layer is disposed on the shielding layer and has a plurality of through holes located on the conductive portion. A touch metal layer is disposed on the insulating layer and includes a plurality of first electrodes arranged in a first direction and a plurality of second electrodes arranged in a second direction. The plurality of first electrodes electrically connect to the conductive portion of the shielding layer through the plurality of through holes, and the shielding portion of the shielding layer is grounded through the touch metal layer.

6 Claims, 4 Drawing Sheets

(52) U.S. Cl.
CPC ........... *G06F 2203/04102* (2013.01); *G06F 2203/04107* (2013.01); *G06F 2203/04111* (2013.01)

(56) References Cited

U.S. PATENT DOCUMENTS

2018/0004027 A1  1/2018  Lin et al.
2019/0114000 A1* 4/2019  Chen .................. G06F 3/0443

* cited by examiner

TOUCH PANEL AND DISPLAY DEVICE WITH SHIELDING LAYER GROUNDED THROUGH TOUCH LAYER

BACKGROUND OF INVENTION

1. Field of Invention

The present invention relates to a technical field of displays, and particularly to a touch panel and a display device.

2. Related Art

With the development of display technology, organic light emitting diode (OLED) panels are used in more and more electronic products, wherein flexible OLED panels have attracted more attention due to their flexibility. Generally, display panels are equipped with touch screens for users to touch and control electronic products. Touch screens have responsive interfaces that save a lot of time and improve work efficiency, so they have been applied to daily lives.

Flexible OLED panels with flexible touch sensors have thus become a trend of current mobile devices. A main type of touch sensors used in flexible OLED panels is additionally attached. That is, the touch sensors are attached to the OLED panels after being formed on a film, and a manufacturing method of the touch sensors is performed directly on the OLED panels. A signal driving pattern (TX) and a signal sensing pattern (RX) on the film are integrated on a same layer. Because the thickness of thin film encapsulation materials is only a few ten micrometers, the touch sensors are very close to an electron emission layer (i.e., a cathode) of OLEDs, and RX and TX are disposed on the same layer, the cathode of OLEDs are coupled with RX of the touch sensors, causing great interference to touch signals and adverse effect on touch performance.

SUMMARY OF INVENTION

An object of the present invention is to provide a touch panel and a display device to reduce interference to touch signals caused by a cathode in the display panel and to improve sensitivity of touch control.

To achieve the above-mentioned object, the touch panel of the present invention comprises a shielding layer comprising a shielding portion and a conductive portion surrounded by the shielding portion; an insulating layer disposed on the shielding layer and having a plurality of through holes located on the conductive portion; a touch metal layer disposed on the insulating layer and comprising a plurality of first electrodes arranged in a first direction and a plurality of second electrodes arranged in a second direction, wherein the plurality of first electrodes electrically connect to the conductive portion of the shielding layer through the plurality of through holes, and the shielding portion of the shielding layer is grounded through the touch metal layer, wherein the plurality of first electrodes are spaced apart from each other, the plurality of second electrode are spaced apart from each other, a plurality of bridging portions are disposed between the plurality of second electrodes and located right above the conductive portion of the shielding layer and are configured to connect the plurality of second electrodes, and the plurality of through holes of the insulating layer are filled with an electrically conductive material to allow the plurality of first electrodes to electrically connect to each other though the conductive portion.

In one preferable embodiment of the present invention, an interval is formed between the shielding portion and the conductive portion of the shielding layer and is configured to surround the conductive portion.

In another preferable embodiment of the present invention, the shielding layer is made of a metal material and is disposed on an encapsulation layer of a display device.

The present invention further provides a touch panel, comprising a shielding layer comprising a shielding portion and a conductive portion surrounded by the shielding portion; an insulating layer disposed on the shielding layer and having a plurality of through holes located on the conductive portion; and a touch metal layer disposed on the insulating layer and comprising a plurality of first electrodes arranged in a first direction and a plurality of second electrodes arranged in a second direction, wherein the plurality of first electrodes electrically connect to the conductive portion of the shielding layer through the plurality of through holes, and the shielding portion of the shielding layer is grounded through the touch metal layer.

In one preferable embodiment of the present invention, the plurality of first electrodes are spaced apart from each other, the plurality of second electrode are spaced apart from each other, and a plurality of bridging portions are disposed between the plurality of second electrodes, located right above the conductive portion of the shielding layer, and configured to connect the plurality of second electrodes.

In another preferable embodiment of the present invention, the plurality of through holes of the insulating layer are filled with an electrically conductive material to allow the plurality of first electrodes to electrically connect to each other through the conductive portion.

In another preferable embodiment of the present invention, an interval is formed between the shielding portion and the conductive portion of the shielding layer and is configured to surround the conductive portion.

In another preferable embodiment of the present invention, a protection layer is disposed on the touch metal layer and is made of an insulating material.

In another preferable embodiment of the present invention, the shielding layer is made of a metal material and is disposed on an encapsulation layer of a display device.

The present invention further provides a display device, comprising a display panel and a touch panel disposed on the display panel, the touch panel comprising a shielding layer disposed on an encapsulation layer of the display panel and comprising a shielding portion and a conductive portion surrounded by the shielding portion; an insulating layer disposed on the shielding layer and having a plurality of through holes located on the conductive portion; and a touch metal layer disposed on the insulating layer and comprising a plurality of first electrodes arranged in a first direction and a plurality of second electrodes arranged in a second direction, wherein the plurality of first electrodes electrically connect to the conductive portion of the shielding layer through the plurality of through holes, and the shielding portion of the shielding layer is grounded through the touch metal layer.

In one preferable embodiment of the present invention, the plurality of first electrodes are spaced apart from each other, the plurality of second electrode are spaced apart from each other, and a plurality of bridging portions are disposed between the plurality of second electrodes, located right above the conductive portion of the shielding layer, and configured to connect the plurality of second electrodes.

In another preferable embodiment of the present invention, the plurality of through holes of the insulating layer are filled with an electrically conductive material to allow the plurality of first electrodes to electrically connect to each other through the conductive portion.

In another preferable embodiment of the present invention, an interval is formed between the shielding portion and the conductive portion of the shielding layer and is configured to surround the conductive portion.

Each of the plurality of first electrodes of the present invention electrically connects to the underneath conductive portion of the shielding layer through the through hole of the insulating layer, and thus the plurality of first electrodes are electrically connected to each other to form Tx channels, thereby efficiently simplifying structural configuration of driving lines. Particularly, the ITO shielding layer of the present invention is grounded by a peripheral ground line (not shown) connected to the touch metal layer, so that the shielding portion forms a barrier over the entire surface, thereby effectively shielding the interference to Rx signals of the plurality of second electrodes (Rx) resulted from the cathode of the OLED display panel. In other words, the shielding portion of the shielding layer effectively protects the plurality of second electrode from being adversely affected by the cathode, reducing the interference to the Rx signals caused by noise generated by the OLED display panel, and thus enhancing a signal-to-noise ratio of the touch panel as well as sensitivity of touch control.

DESCRIPTION OF PREFERRED EMBODIMENTS

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

The present invention is directed to a touch panel and a display device capable of realizing touch positioning according to capacitance change of the touch panel.

Figure 1:
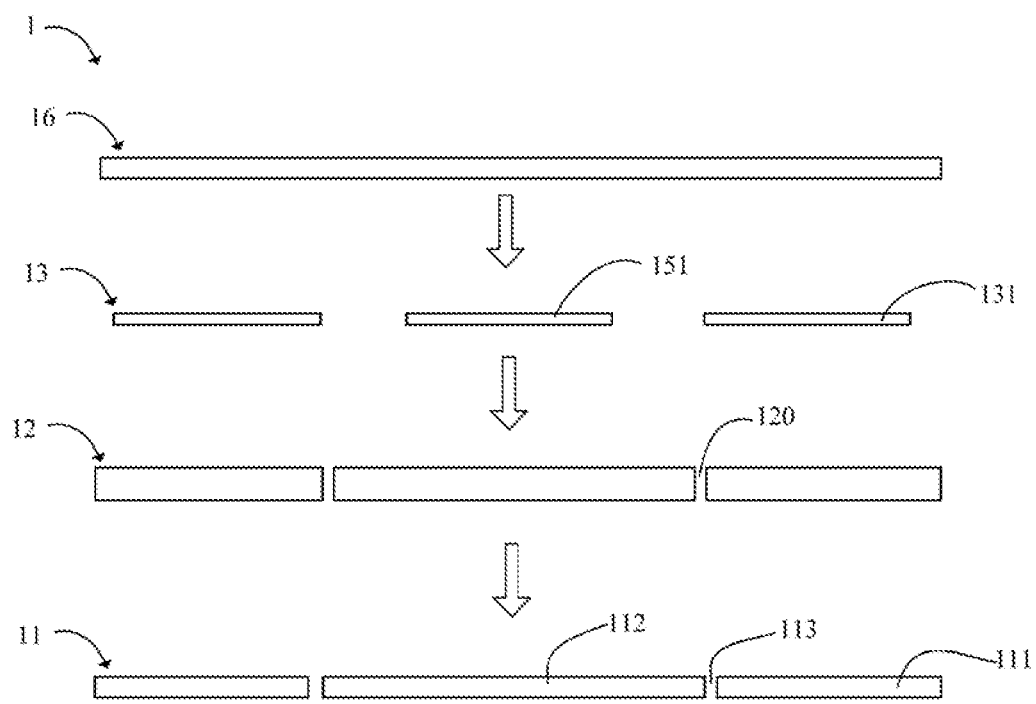
FIG. 1 is a schematic exploded sectional view showing a partial structure of a touch panel in accordance with a preferable embodiment of the present invention.
Figure 2:
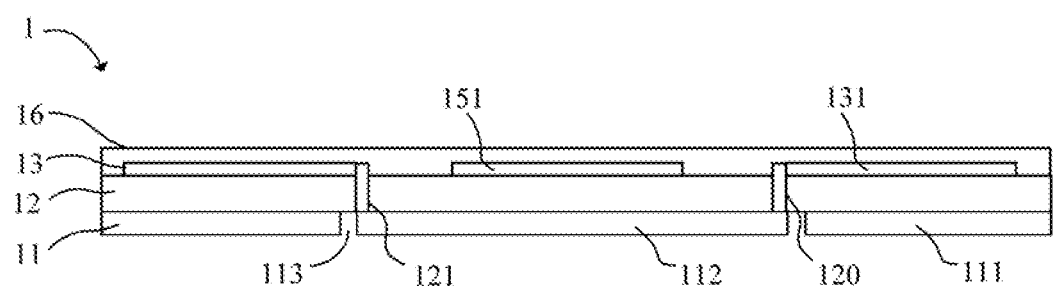
FIG. 2 is a schematic sectional structural view of the touch panel of FIG. 1.

FIG. 1 is a schematic exploded sectional view showing a partial structure of a touch panel in accordance with a preferable embodiment of the present invention. FIG. 2 is a schematic sectional structural view of the touch panel of FIG. 1. A touch panel 1 of the present invention includes a shielding layer 11 containing indium tin oxide (ITO). The shielding layer 11 forms a patterned shielding layer including a shielding portion 111 and a conductive portion 112 through a photolithography process of exposure and development. In this preferable embodiment, the conductive portion 112 is located inside the shielding portion 111 with an interval 113 formed between the shielding portion 111 and the conductive portion 112. An insulating layer 12 is disposed on the shielding layer 11 and forms a flat surface. The insulating layer 12 is made of silicon dioxide and has a plurality of through holes 120 spaced apart from each other and located on the conductive portion 112 of the shielding layer 11. A touch metal layer 13 is disposed on the insulating layer 12. The touch metal layer 13 forms a patterned metal layer including a plurality of first electrode units 131 and a plurality of second electrode units 132 through the photolithography process of exposure and development, wherein the touch metal layer 13 is made of copper, silver, or ITO, and the plurality of first electrode units 131 and the second electrode units 132 are located above the shielding portion 111. Furthermore, a protection layer 16 is disposed on the touch metal layer 13 and is made of an insulating material to protect wires on the touch metal layer 13. The first electrode units 131 and the second electrode units 132 are located at a same layer and thus are capable of providing more uniform sensing sensitivity for an electrically conductive target touching or close to the touch metal layer 13.

Figure 6:
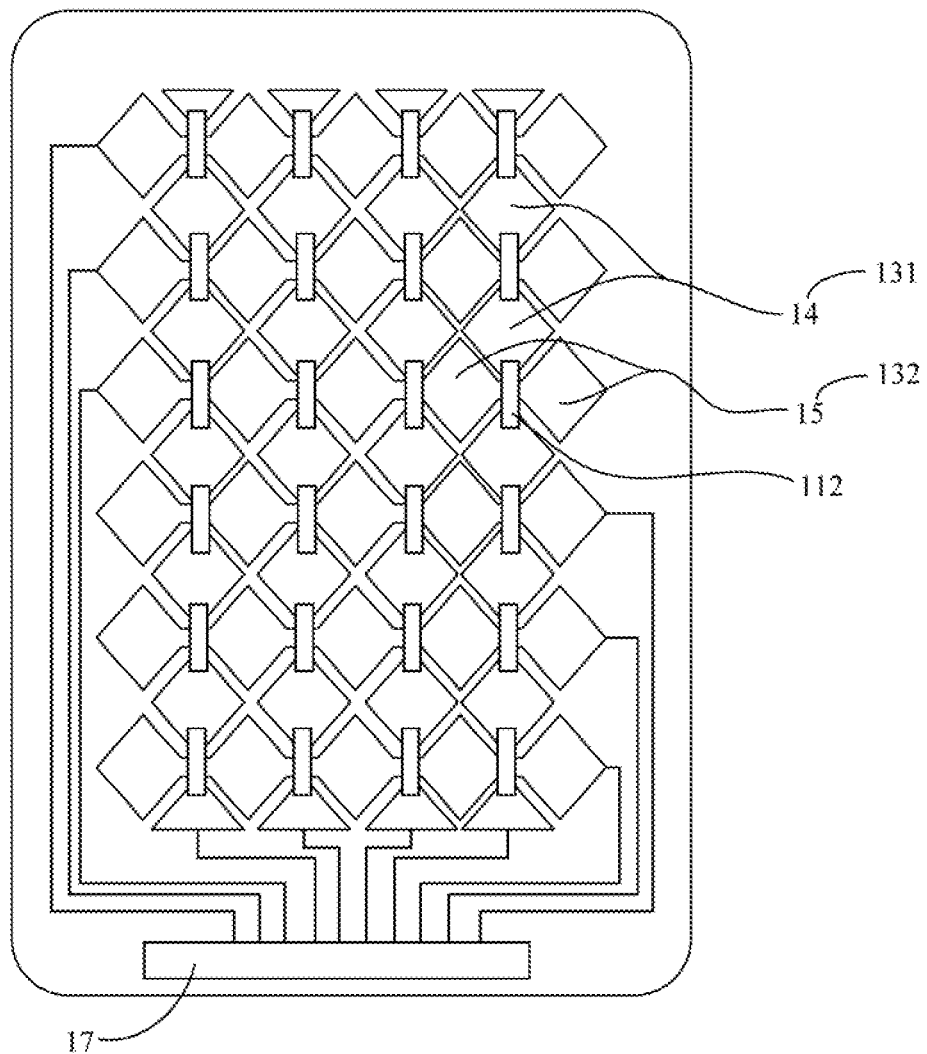
FIG. 6 is a schematic structural view of a touch panel device in accordance with a preferable embodiment of the present invention.

Please continuously review FIG. 2 in combination with FIG. 6. Each of the first electrode units 131 includes a plurality of first electrodes (Tx) 14 arranged in a first direction, and each of the second electrode units 132 includes a plurality of second electrodes (Rx) 15 arranged in a second direction, wherein the first direction is extending longitudinally, and the second direction is extending transversely. In the preferable embodiment, each of the plurality of first electrodes 14 and the second electrodes 15 is diamond in shape, wherein the plurality of first electrodes 14 are driving electrodes and the plurality of second electrodes 15 are sensing electrodes and are all evenly distributed on the insulating layer 12. The plurality of first electrodes 14 and second electrodes 15 cooperatively form a touch sensing unit, thereby forming a mutual capacitive touch screen structure for touch sensing and achieving touch control.

Figure 3:
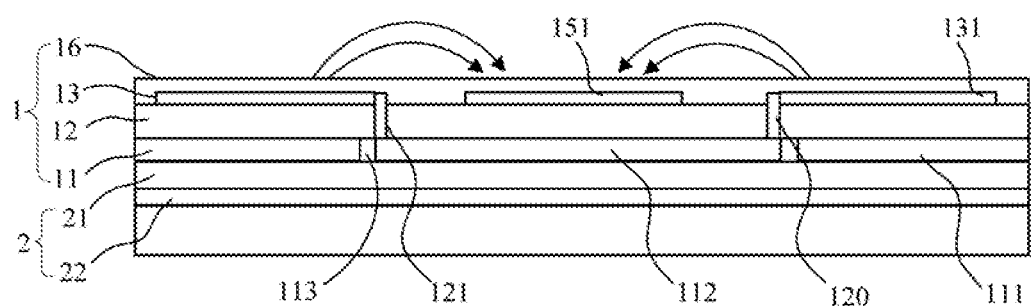
FIG. 3 is a schematic sectional structural view of a touch display device of the present invention.

FIG. 3 is a schematic sectional structural view of a touch display device of the present invention. Specifically, FIG. 3 is a schematic sectional view taken along a line A-A of FIG. 5. The touch panel 1 of the present invention is disposed on an organic light emitting diode (OLED) display panel 2. Specifically, the shielding layer 11 is disposed on an encapsulation layer 21 of the OLED display panel 2, and the encapsulation layer 21 is formed on a cathode 22 of the OLED display panel 2. As shown in FIG. 3, the shielding layer 11, the insulating layer 12, the touch metal layer 13, and the protection layer 16 are disposed on the encapsulation layer 21 from bottom to top in turn.

Figure 4:
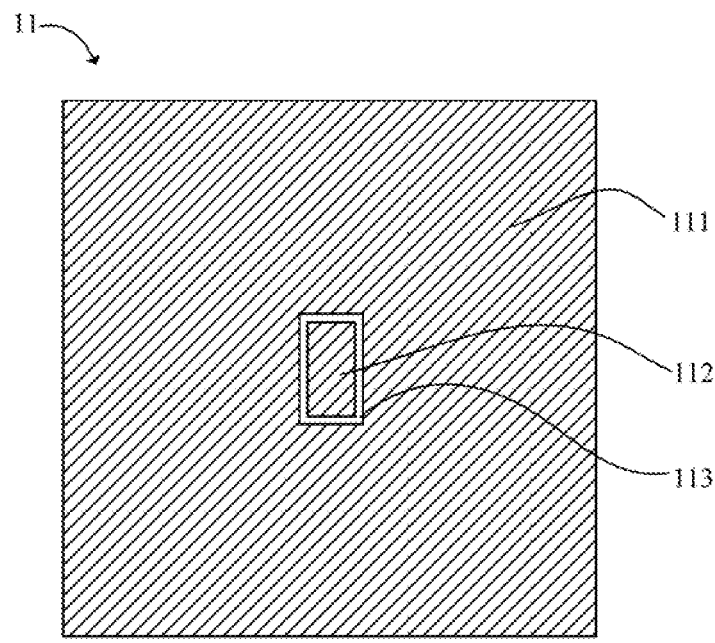
FIG. 4 is a schematic structural view of a shielding layer of a touch panel of the present invention.
Figure 5:
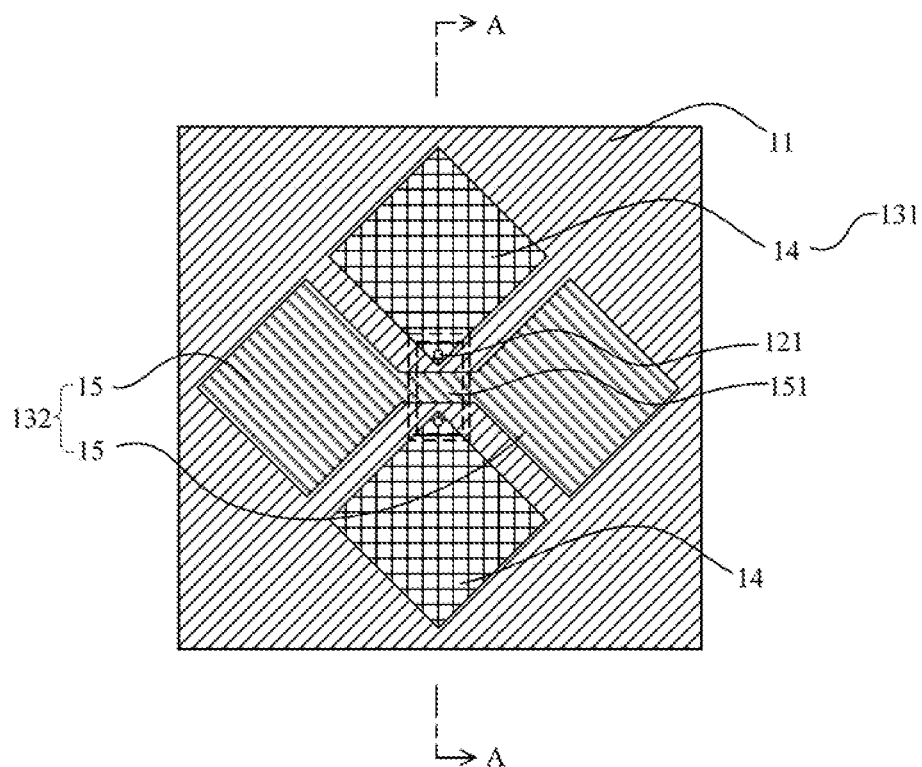
FIG. 5 is a schematic sectional view showing a partial structure of a touch display panel of the present invention.

FIG. 4 is a schematic structural view of a shielding layer of a touch panel of the present invention. As shown in FIG. 4, the interval 113 formed between the shielding portion 111 and the conductive portion 112 of the shielding layer 11 is configured to surround the conductive portion 112, wherein the conductive portion 112 is rectangular in shape. FIG. 5 is a schematic structural view showing one of the first electrode units 131 and one of the second electrode units 132 of the touch panel 1 of the present invention. Please refer to FIGS. 5 and 3. Opposite two end portions of each of the first electrodes 14 of the first electrode unit 131 adjoin the through holes 120 of the insulating layer 12. The through holes 120 are filled with an electrically conductive material 121. In this preferable embodiment, the electrically conductive material 121 is ITO, but can also be replaced by other materials having conductive properties. The plurality of first electrodes 14 are electrically connect to each other though the electrically conductive material 121 inside the through holes 120 and the conductive portion 112 of the shielding layer 11, thereby to form a first electrode channel.

Please continuously refer to FIG. 5. A plurality of bridging portions 151 are disposed between the plurality of second electrodes 15 of the second electrode units 132, located right above the conductive portion 112 of the shielding layer 11, and configured to connect the plurality of second electrodes 15. As shown in FIG. 6, both the plurality of first electrodes 14 and second electrodes 15 are connected to a control chip 17 located at a periphery of the touch panel 1 through signal lines for providing driving signals and receiving sensing signals.

As described above, each of the plurality of first electrodes 14 of the present invention electrically connects to the underneath conductive portion 112 of the shielding layer 11 through the through holes 120 of the insulating layer 12, and thus the plurality of first electrodes 14 are electrically connected to each other to form Tx channels, thereby efficiently simplifying the structural configuration of driving lines. Particularly, the ITO shielding layer 11 of the present invention is grounded by a peripheral ground line (not shown) connected to the touch metal layer 13, so that the shielding portion 111 forms a barrier over the entire surface, thereby effectively shielding the interference to Rx signals of the plurality of second electrodes (Rx) 15 resulted from the cathode 22 of the OLED display panel 2. In other words, the shielding portion 111 of the shielding layer 11 effectively protects the plurality of second electrode 15 from being adversely affected by the cathode 22, reducing the interference to the Rx signals caused by noise generated by the OLED display panel 2, and thus enhancing a signal-to-noise ratio of the touch panel as well as sensitivity of touch control.

Accordingly, although the present invention has been disclosed as a preferred embodiment, it is not intended to limit the present invention. Those skilled in the art without departing from the spirit and scope of the present invention may make various changes or modifications, and thus the scope of the present invention should be after the appended claims and their equivalents.

What is claimed is:

1. A touch panel, comprising:
   a shielding layer comprising a shielding portion and a conductive portion surrounded by the shielding portion;
   an insulating layer disposed on the shielding layer and having a plurality of through holes located on the conductive portion;
   a touch metal layer disposed on the insulating layer and comprising a plurality of first electrodes arranged in a first direction, a plurality of second electrodes arranged in a second direction, and the first electrodes and the second electrodes located over the shielding layer, wherein the plurality of first electrodes electrically connect to the conductive portion of the shielding layer through the plurality of through holes, opposite ends of each of the first electrodes extend over and completely cover the through holes, and the shielding portion of the shielding layer is grounded through the touch metal layer;
   wherein the plurality of first electrodes are spaced apart from each other, the plurality of second electrode are spaced apart from each other, a plurality of bridging portions are disposed between the plurality of second electrodes and located right above the conductive portion of the shielding layer and are configured to connect the plurality of second electrodes, and the plurality of through holes of the insulating layer are filled with an electrically conductive material to allow the plurality of first electrodes to electrically connect to each other though the conductive portion.

2. The touch panel of claim 1, wherein an interval is formed between the shielding portion and the conductive portion of the shielding layer and is configured to surround the conductive portion.

3. The touch panel of claim 1, wherein the shielding layer is made of a metal material and is disposed on an encapsulation layer of a display device.

4. A display device, comprising a display panel and a touch panel disposed on the display panel, the touch panel comprising:
   a shielding layer disposed on an encapsulation layer of the display panel and comprising a shielding portion and a conductive portion surrounded by the shielding portion;
   an insulating layer disposed on the shielding layer and having a plurality of through holes located on the conductive portion; and
   a touch metal layer disposed on the insulating layer and comprising a plurality of first electrodes arranged in a first direction, a plurality of second electrodes arranged in a second direction, and the first electrodes and the second electrodes located over the shielding layer, wherein the plurality of first electrodes electrically connect to the conductive portion of the shielding layer through the plurality of through holes, opposite ends of each of the first electrodes extend over and completely cover the through holes, and the shielding portion of the shielding layer is grounded through the touch metal layer;
   wherein the through holes of the insulating layer are filled with an electrically conductive material to allow the first electrodes to electrically connect to each other through the conductive portion.

5. The display device of claim 4, wherein the plurality of first electrodes are spaced apart from each other, the plurality of second electrode are spaced apart from each other, and a plurality of bridging portions are disposed between the plurality of second electrodes, located right above the conductive portion of the shielding layer, and configured to connect the plurality of second electrodes.

6. The display device of claim 4, wherein an interval is formed between the shielding portion and the conductive portion of the shielding layer and is configured to surround the conductive portion.

* * * * *